US006859057B2

(12) United States Patent
Malathong et al.

(10) Patent No.: US 6,859,057 B2
(45) Date of Patent: Feb. 22, 2005

(54) DIE CARRIER

(75) Inventors: Seang P. Malathong, Redwood City, CA (US); Martin A. Hemmerling, Menlo Park, CA (US)

(73) Assignee: Aehr Test Systems, Fremont, CA (US)

( * ) Notice: Subject to any disclaimer, the term of this patent is extended or adjusted under 35 U.S.C. 154(b) by 0 days.

(21) Appl. No.: 10/245,934

(22) Filed: Sep. 17, 2002

(65) Prior Publication Data

US 2004/0051544 A1 Mar. 18, 2004

(51) Int. Cl.[7] ............................................... G01R 31/02
(52) U.S. Cl. ...................................... 324/755; 324/765
(58) Field of Search ........................ 324/72.5, 754–755, 324/760–762, 765, 158.1; 439/68, 71, 82, 876

(56) References Cited

U.S. PATENT DOCUMENTS

| 5,517,125 A | 5/1996 | Posedel et al. |
| 5,519,332 A | 5/1996 | Wood et al. |
| 5,705,933 A | 1/1998 | Lim et al. |
| 5,731,709 A | * 3/1998 | Pastore et al. ............... 324/760 |
| 6,025,732 A | 2/2000 | Foo et al. |
| 6,072,326 A | * 6/2000 | Akram et al. ............... 324/765 |

* cited by examiner

Primary Examiner—Minh N. Tang
(74) Attorney, Agent, or Firm—Blakely, Sokoloff, Taylor & Zafman; Stephen M. De Klerk

(57) ABSTRACT

A die carrier is disclosed which is specifically designed for use in a TSOP socket. More specifically, the die carrier has a carrier substrate with carrier contacts thereon that are dimensioned specifically to match the positioning of the upper and lower socket contacts. The carrier substrate, being 145 microns thick, can also fit between the upper and lower socket contacts. A carrier base support component is located below a portion only of the carrier substrate, and does not impair insertion of the carrier substrate into the relatively small spacing between the upper and lower socket contacts. Damage to the carrier substrate is avoided by clamping edges of the carrier substrate from opposing sides between the upper and lower socket contacts. There are no screws or nuts within the carrier base support component that may increase its size and prevent it from being inserted into the socket.

14 Claims, 5 Drawing Sheets

DIE CARRIER

BACKGROUND OF THE INVENTION

1). Field of the Invention

This invention relates to a die carrier of the kind used for temporarily holding a microelectronic die for purposes of burn-in and other testing of the die. The invention also relates to a microelectronic die connection assembly, including a socket which can be connected to a circuit board, and a die carrier that is designed for the socket.

2). Discussion of Related Art

Integrated circuits are usually manufactured in and on semiconductor wafers. Such a semiconductor wafer is subsequently cut into individual dice, each die carrying a respective integrated circuit. Cutting of a wafer into individual dice is commonly referred to as "dicing" or "singulation."

Once the individual dice are cut from the wafer, it is often advantageous to test the integrated circuit in each die before the packaging of the die. The added expense of packaging of the die can be avoided by first identifying defects in the die. Identification of defects is particularly important for multiple-die assemblies, where one defective die can compromise the value of the entire assembly.

One way of testing a singulated unpackaged die is to temporarily insert the die into a retaining formation in a carrier body of a die carrier. A plurality of die contacts in the retaining formation make contact with respective ones of a plurality of terminals on the die. External carrier contacts are electrically connected to the die contacts, and provide surfaces to which electric contact can be made for purposes of providing signals between the carrier contacts and the terminals on the die.

The die carrier is then inserted into a socket. The socket has a plurality of electrically conductive pins which connects to a circuit board. The socket also has a plurality of socket contacts that are electrically connected to the pins and make contact with the carrier contacts. Electric current can thus conduct through the circuit board through the circuit board connectors and the socket contacts to the carrier contacts. An electric path is thereby established between the circuit board and the unpackaged die, and can be used for testing the integrated circuit in the die.

A few types of sockets exist that are used for testing thin small-outline package (TSOP) electronic assemblies. A TSOP is a package having a microelectronic die that is inserted within a mold and having a plurality of 145 micron thin electric leads extending from opposing sides thereof. No die carrier has been designed for use within a TSOP-type socket.

SUMMARY OF THE INVENTION

According to one aspect of the invention, a microelectronic die connection assembly is provided. The connection assembly includes a socket and a die carrier. The socket includes a socket body, a plurality of electrically conductive circuit board connectors, left and right-spaced rows of electrically conductive lower socket contacts, and left and right-spaced rows of electrically conductive upper socket contacts. The circuit board connectors are located externally on the socket body. The lower and upper socket contacts are also on the socket body, and at least some of the lower socket contacts and at least some of the upper socket contacts are electrically connected to at least some of the circuit board connectors. The upper socket contacts are actuable to move between retracted and contacting positions relative to the left and right rows of lower socket contacts, respectively. The die carrier includes a carrier body, a plurality of die contacts, and left and right rows of carrier contacts. The carrier body has a retaining formation to temporarily and removably receive a microelectronic die. The die contacts are located in the retaining formation to make contact with respective ones of a plurality of terminals on the die. The carrier contacts are located on and extend from opposing sides of the carrier body. The carrier contacts are electrically connected to the die contacts. The rows of carrier contacts are at a select spacing relative to one another, so as to be insertable between the left and right rows of upper socket contacts when the upper socket contacts are in their retracted position, and so that each carrier contact is located between a respective pair of upper and lower socket contacts when the upper socket contacts are in their contacting positions.

According to a further aspect of the invention, a die carrier is provided, comprising a carrier support component, a carrier substrate, a plurality of die contacts, and a plurality of carrier contacts. The carrier support component has a first width. The carrier substrate is located on the carrier support component, the carrier substrate having a second width so that left and right portions of the carrier substrate extend beyond the carrier base support component. The carrier body is located on the carrier substrate, the carrier body having a formation to temporarily and removably receive a microelectronic die. The die contacts are located within the retaining formation on the carrier substrate, to make contact with respective ones of a plurality of terminals on the die. The carrier contacts are located on at least one surface of each of the left and right portions of the carrier substrate, the carrier contacts being electrically connected to the die contacts.

According to a further aspect of the invention, a die carrier is provided, comprising a carrier base, a carrier substrate, a carrier hinge base, a carrier body, a carrier hinge component, and a carrier hinge pin. The carrier substrate is located on the carrier base component. The carrier hinge base is located on the carrier base. The carrier body is located on the substrate, and has a formation to temporarily and removably receive a microelectronic die. The carrier hinge pin is inserted through openings in the carrier hinge base and the carrier body to secure the carrier body to the carrier hinge base, and through an opening in the carrier hinge component to secure the carrier hinge component pivotably to the carrier hinge base.

According to a further aspect of the invention, a die carrier is provided, comprising a carrier substrate, a carrier body, a plurality of die contacts, and a plurality of lower carrier contacts. The carrier body is located on the substrate, and has a retaining formation to temporarily and removably receive a microelectronic die. The die contacts are located in the retaining formation on an upper side of the substrate to make contact with respective ones of a plurality of terminals on the die. The lower carrier contacts are located on lower sides of left and right portions of the substrate, extending beyond the carrier body, and are electrically connected to at least some of the die contacts.

BRIEF DESCRIPTION OF THE DRAWINGS

The invention is further described by way of example with reference to the accompanying drawings, wherein:

FIG. 1A is a cross-sectional side view illustrating the positioning of a compliant rubber membrane in the die carrier of FIG. 1;

DETAILED DESCRIPTION OF THE INVENTION

Figure 1:
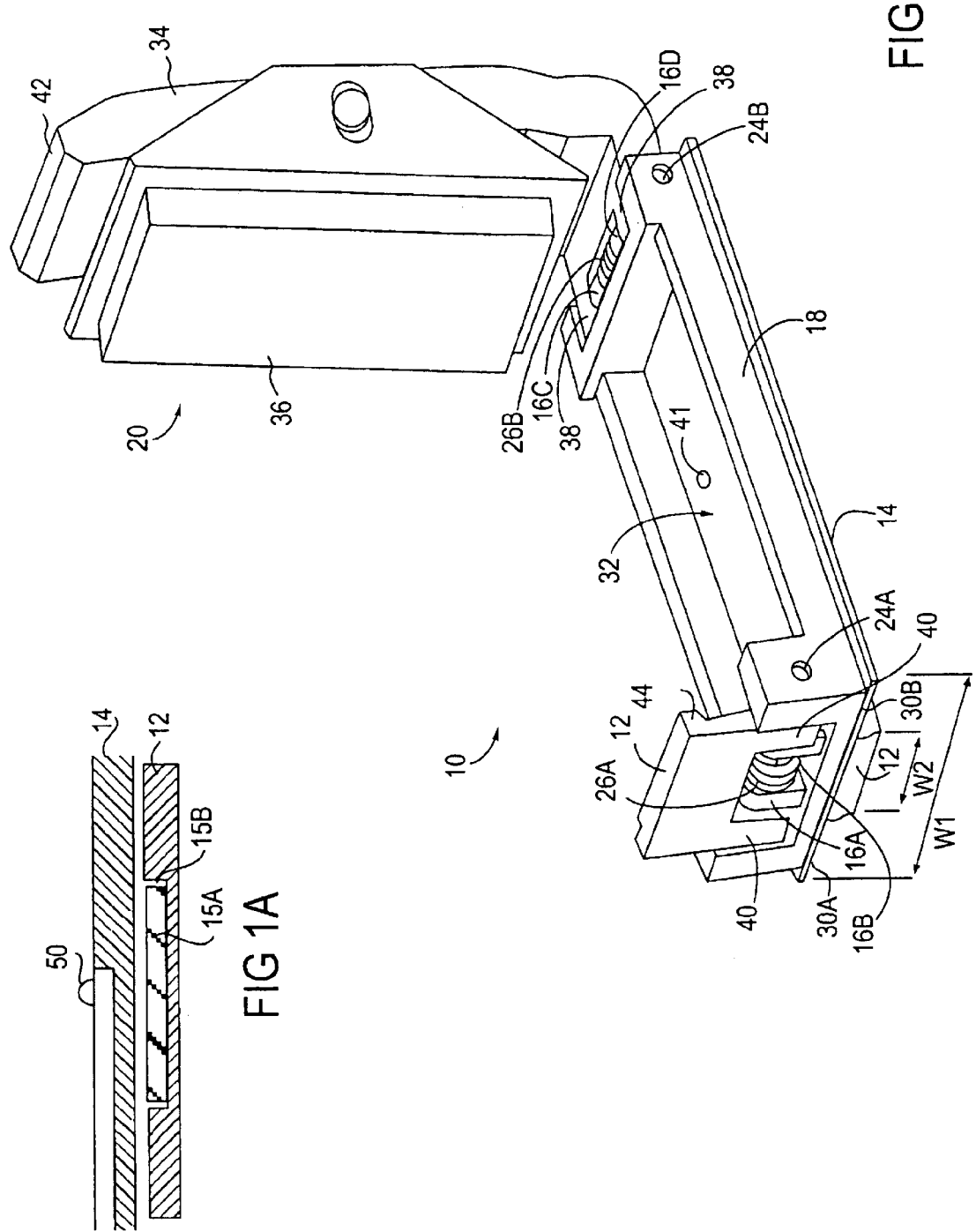
FIG. 1 is a perspective view of a die carrier according to an embodiment of the invention.

FIG. 1 of the accompanying drawings illustrates a die carrier 10 according to an embodiment of the invention, which includes a carrier base support component 12, a carrier substrate 14, four carrier hinge bases 16A–D, a carrier body 18, a carrier cover 20, a carrier latch 22, front and rear carrier hinge pins 24A and 24B, and front and rear carrier springs 26A and 26B.

The carrier hinge bases 16A–D are molded together with and therefore secured to the carrier base support component 12. The carrier hinge bases 16A and 16B are spaced from one another and extend upward from a front portion of the carrier base support component 12. The carrier hinge bases 16C and 16D are spaced from one another and extend upward from a rear portion of the carrier base support component 12.

The carrier substrate 14 has a thickness of approximately 145 microns. In another embodiment, the carrier substrate 14 may be between 135 and 155 microns thick. The carrier substrate 14 has four openings, each of which is positioned over a respective one of the carrier hinge bases 16A–D. As illustrated in FIG. 1A, a central portion of the carrier substrate 14 rests partially on the carrier base support component 12 and partially on a compliant rubber membrane 15A that seats in a pocket 15B in a top surface of the carrier base support component 12. The carrier substrate 14 has a width W-1 which is more than a width W-2 of the carrier base support component 12, so that left and right portions 30A and 30B of the carrier substrate 14 extend beyond the carrier base support component 12.

The carrier body 18 also has four openings, each of which is positioned over a respective one of the carrier hinge bases 16A–D. The carrier hinge bases 16A–D align the carrier body 18 with respect to the carrier substrate 14. The carrier body 18 has a retaining formation 32 formed therein. Sides of the retaining formation 32 are formed by respective portions of the carrier body 18, and a base of the formation 32 is formed by the carrier substrate 14.

The carrier cover 20 includes a cover hinge component 34 and a cover pressure plate 36. The cover pressure plate 36 is secured to the cover hinge component 34 in a manner that allows for pivoting or rocking of the cover pressure plate 36 relative to a cover hinge component 34, and for the cover pressure plate 36 to be depressed toward the cover hinge component 34. A compression spring (not shown) between the cover hinge component 34 and cover pressure plate 36 biases the cover pressure plate 36 away from the cover hinge component 34.

The cover hinge component 34 has two end components 38 that are positioned over the carrier hinge bases 16 C and 16D. The rear carrier torsion spring 26B is inserted between the carrier hinge bases 16C and 16D.

The carrier latch 22 has two end portions 40 that are positioned over the carrier hinge bases 16A and 16B. The front carrier torsion spring 26A is inserted between the carrier hinge bases 16A and 16B.

The front carrier hinge pin 24A is inserted through openings in portions of the carrier body 18, the end portions 40 of the carrier latch 22, the carrier hinge bases 16A and 16B, and through the front carrier torsion spring 26A. The front carrier hinge pin 24A so secures a front portion of the carrier body 18 through the carrier hinge bases 16A and 16B to the carrier base support component 12 without the need for any additional space-consuming screws or nuts, and simultaneously secures the carrier latch 22 pivotably to the carrier body 18.

Similarly, the rear carrier hinge pin 24B is inserted through openings in portions of the carrier body 18, the end portions 38 of the cover hinge component 34, the carrier hinge bases 16C and 16D, and through the rear carrier torsion spring 26B. The rear carrier hinge pin 24B so secures a rear portion of the carrier body 18 through the carrier hinge bases 16C and 16D to the carrier base support component 12, and simultaneously secures the cover hinge component 34 pivotably to the carrier body 18.

In use, a microelectronic die (not shown) is inserted into the retaining formation 32 with terminals of the microelectronic die located on the carrier substrate 14. This orientation of the die is termed "flip chip" in the electronic industry. A vacuum is applied through suction holes 41 in the carrier substrate 14 and carrier base support component 12 to hold the die down.

The carrier cover 20 is then pivoted about the rear carrier hinge pin 24B and against a spring force created by the rear carrier spring 26B, so that the cover pressure plate 36 comes into contact with an upper surface of the microelectronic die (back side of die in flip chip orientation). Pivoting of the cover pressure plate 36 relative to the cover hinge component 34 allows for leveling of a surface of the cover pressure plate 36 on the upper surface of the microelectronic die. When pressure is applied to an external surface of the cover hinge component 34, a force is created by the spring between the cover pressure plate 36 and the cover hinge component 34, which biases the microelectronic die against the carrier substrate 14.

A tip 42 of the cover hinge component 34 moves an engaging formation 44 of the carrier latch 22 against a spring force created by the front carrier spring 26A. The engaging formation 44 subsequently "snaps" over the tip 42 and retains the carrier cover 20 in a closed position. The microelectronic die is then held within the retaining formation 32.

Figure 2:
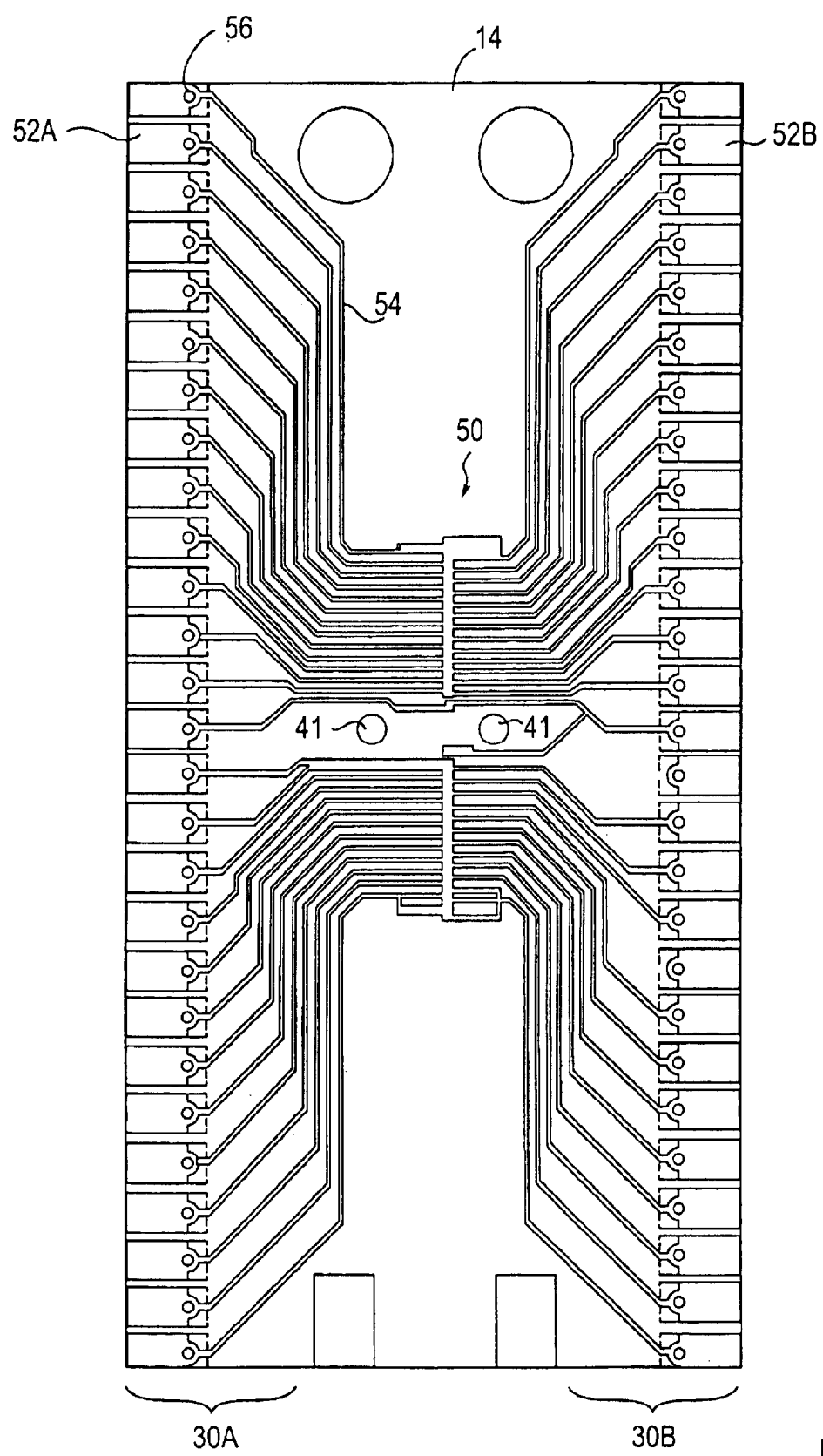
FIG. 2 is top plan view illustrating die contacts, carrier contacts, and fan-out traces on an upper surface of a carrier substrate forming part of the die carrier of FIG. 1.

As illustrated in FIG. 2, the nonconductive carrier substrate 14 has a number of conductive features formed thereon and therein, including a plurality of die contacts 50, a plurality of carrier contacts 52, and a plurality of fan-out traces 54. The die contacts 50 are located in a central region of the carrier substrate 14. The die contacts 50 correspond to the layout of the terminals on the microelectronic die, so that each terminal on the microelectronic die makes contact with a respective one of the die contacts 50. The carrier base component 12 and the pocketed compliant rubber membrane 15A provide opposing support for the carrier substrate 14. The rubber membrane 15A, due to its compliancy, allows for vertical movement of the die contacts relative to the carrier base support component 12 and ensures proper contact between each one of the die contacts 50 on the carrier substrate 14 with each one of the terminals on the die. In another embodiment, compliance may be provided by the carrier substrate 14, the die contacts 50, or the terminals on the die.

The carrier contacts 52 are located in left and right rows 52A and 52B respectively on edges of the left and right portions 30A and 30B of the carrier substrate 14. Each one of the carrier contacts 52A or 52B is connected through a respective fan-out trace 54 to a respective one of the die contacts 50. More carrier contacts (not shown) are formed on a lower surface of the carrier substrate 14. The carrier contacts on the lower surface of the carrier substrate 14 have a layout that corresponds to the layout of the carrier contacts 52A and 52B on the upper surface of the carrier substrate 14. A respective via 56 within the carrier substrate 14 interconnects a respective one of the carrier contacts 52A or 52B with a respective one of the carrier contacts on the lower surface of the carrier substrate 14. Each carrier contact on the lower surface of the carrier substrate 14 is thus also electrically connected through a respective via 56 and fan-out trace 54 to a respective one of the die contacts 50.

In the particular embodiment, there are 27 of the carrier contacts 52A and 27 of the carrier contacts 52B. In another embodiment, there may be between 22 and 35 carrier contacts in a particular row. One other embodiment has 33 carrier contacts on a particular side. In the particular embodiment, the carrier substrate 14 has a width of approximately 12 mm and a length of approximately 21 mm. In another embodiment, the width may be between 9 and 13 mm, and the length may be between 18 and 24 mm.

The die carrier 10 is first inserted into a test contactor for purposes of performing a pre-burn-in test on the die. The test contactor is designed to accommodate a typical TSOP electronic assembly, and the die carrier 10, its shape, dimensions, and contact layout are designed to fit into and cooperate with the test contactor, with the carrier contacts on the lower surface of the carrier substrate 14 making contact with corresponding contacts of the test contactor. The die carrier 10 with the die is removed from the test contactor upon completion of the pre-burn-in test, and inserted into a typical TSOP burn-in socket for purposes of carrying out a burn-in test.

Figure 4:
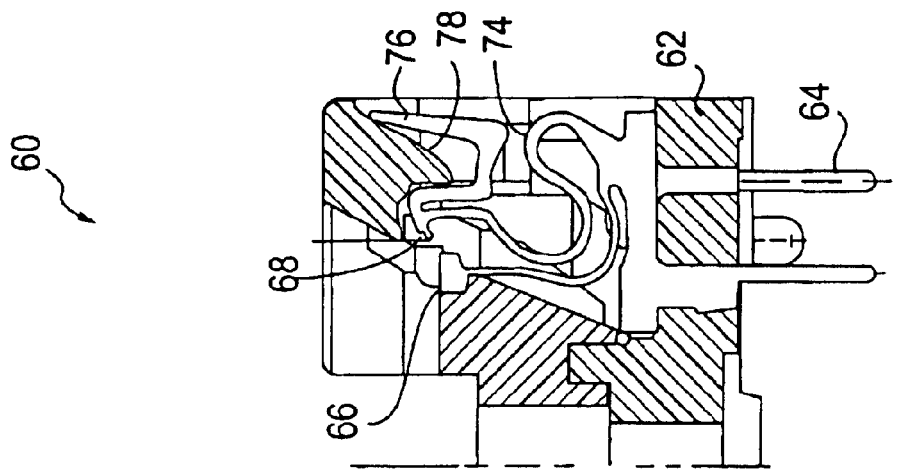
FIG. 4 is a cross-sectional end view of a portion of the socket illustrating movement of upper socket contacts thereof into a retracted position.
Figure 3:
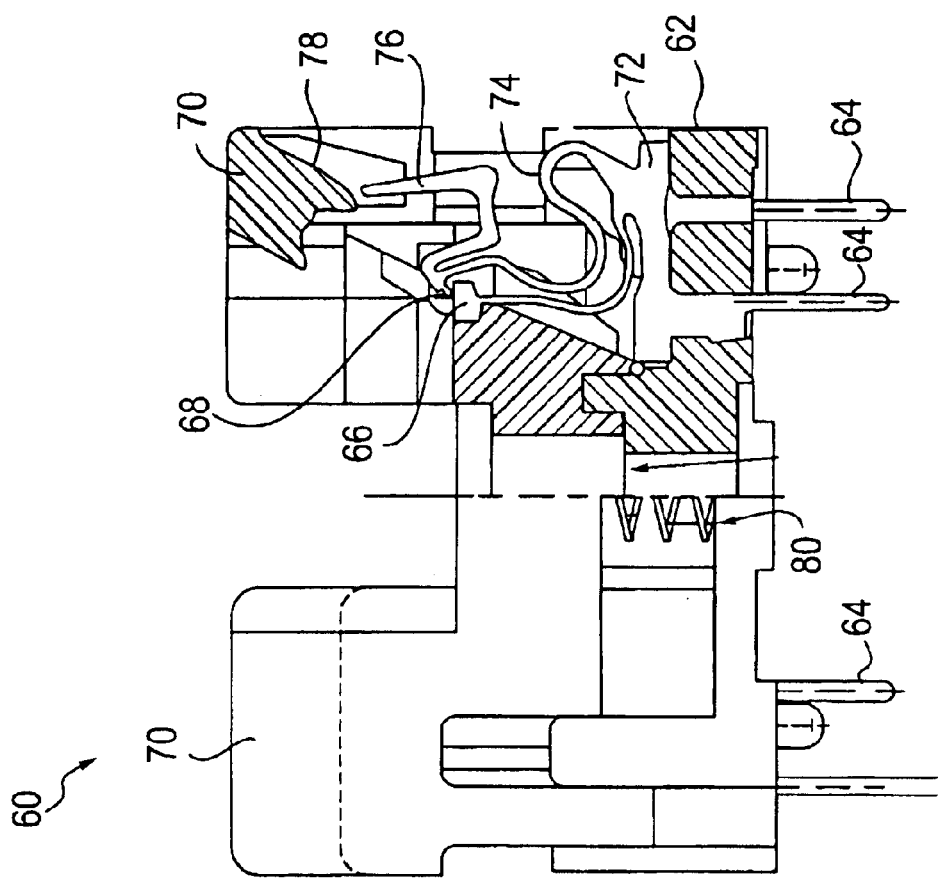
FIG. 3 is a partially cross-sectioned end view of a socket for which the die carrier of FIG. 1 is designed.

FIGS. 3 and 4 illustrate a typical TSOP burn-in socket 60 for which the die carrier 10 of FIG. 1 is designed. The left half of FIG. 3 illustrates external components of the socket 60, and the right half illustrates internal components in cross-section. A cross-section through the left half would mirror of the cross-section of the right half shown in FIG. 3.

The socket 60 includes a socket body 62, circuit board connector pins 64, left and right rows (only the right row shown) of electrically conductive lower socket contacts 66, left and right rows (only the right row shown) of electrically conductive upper socket contacts 68, and a socket actuator component 70.

The circuit board connector pins 64 are secured and extend from a lower surface of the socket body 62. The circuit board connector pins 64 are inserted into corresponding holes in a circuit board of a burn-in board (not shown). More pockets are connected in a similar manner to the circuit board. Electric current can be provided from the circuit board through the circuit board connector pins 64 to the lower socket contacts 66 and the upper socket contacts 68. A plurality of sockets such as the sockets 60 are usually connected to one circuit board and form a permanent or semi-permanent assembly.

A plurality of common junctions 72 are secured within the socket body 62 and are electrically insulated from one another. Each circuit board connector pin 64 is electrically connected to a respective one of the common junctions 72.

Each lower socket contact 66 is electrically connected to a respective common junction 72, and is at the location wherein an upper surface of the respective lower socket contact 66 is exposed. Each upper socket contact is connected through a respective clamping spring 74 to a respective common junction 72. Each upper socket contact 68 is movable between a contacting position as shown in FIG. 3 and a retracted position as shown in FIG. 4. In the contacting position, the respective upper socket contact 68 can move into contact with the upper surface a respective lower socket contact 66. The respective lower and upper socket contacts 66 and 68 referred to are both connected to a respective common junction 72, and are thus at the same voltage as the respective common junction 72. In the retracted position, as shown in FIG. 4, the clamping spring 74 is bent so that the respective upper socket contact 68 moves upward and to the right of the respective lower socket contact 66.

The socket actuator component 70 is secured to the socket body 62 for movement between a raised position illustrated in FIG. 3 and a lowered position illustrated in FIG. 4. A respective link component 76 is secured to each respective upper socket contact 68 and slides along a surface 78 of the socket actuator component 70, such that a tip of the link component 76 moves to the right when the socket actuator component 70 is lowered. Movement of the link component 76 to the right permits the upper socket contact 68 to move upward and to the right of the lower socket contact 66.

All the upper socket contacts 68 in a particular row move in unison upward and to the right. The upper socket contacts in the left half of the socket 60 simultaneously move in unison upward and to the left. A spacing between the left and right rows of upper socket contacts 68 thus increases when the socket actuator component 70 is lowered. This spacing again decreases when the socket actuator component is raised under the restoring force of a socket spring 80 between the socket body 62 and the socket actuator component 70.

In use, the upper socket contacts 68 are moved into the retracted position shown in FIG. 4. The die carrier 10 of FIG. 1 with the microelectronic die held therein is then inserted into the socket 60. The left and right rows of carrier contacts 52 on the lower surface of the carrier substrate 14 are positioned on top of the left and right rows of lower socket contacts 66. The upper socket contacts 68 are then moved into the position shown in FIG. 3, with the carrier substrate 14 clamped between the upper and lower socket contacts 68 and 66. Each one of the upper socket contacts 68 on the right in FIG. 3 makes contact with a respective one of the carrier contacts 52B in the row on the right in FIG. 2. Similarly, each one of the upper socket contacts in the left of the socket 60 of FIG. 3 makes contact with a respective one of the carrier contacts 52A in the row on the left in FIG. 2. The pitch between the carrier contacts 52B in the row on the right thus corresponds to the pitch between the upper socket contacts 68. Furthermore, the spacing between the left and right rows of carrier contacts 52A and 52B is designed to correspond to the spacing between the left and right rows of upper socket contacts 68. Current can now conduct through respective circuit board connector pins 64, common junction 72, a respective pair of upper and lower socket contacts 68 and 66, a respective pair of carrier contacts 52 on upper and lower surfaces (only 52 on the upper surface shown) of the carrier substrate 14, a respective fan-out trace 54, and a respective die contact 50, to or from a respective terminal on the microelectronic die.

What should generally be noted is that the die carrier 10 of FIG. 1 is specifically designed to be used within the socket 60. More specifically, the die carrier 10 has a substrate 14 with carrier contacts 52 thereon that are dimensioned specifically to match the positioning of the upper and lower socket contacts 68 and 66. The carrier substrate 14, being 145 microns thick, can also fit between the upper and lower socket contacts 68 and 66. The carrier base support component 12, being located below only a portion of the carrier substrate 14, does not impair insertion of the carrier substrate 14 into the relatively small spacing between the upper and lower socket contacts 68 and 66. Damage to the carrier substrate 14 is avoided by clamping edges of the carrier substrate 14 from opposing sides between the upper and lower socket contacts 68 and 66. What should also be noted is that there are no screws or nuts within the carrier base support component 12 that may increase its size and prevent it from being inserted into the socket 60. What should further be noted is that a double-sided, robust electrical connection is made by each respective pair of upper and lower socket contacts 68 and 66.

The die carrier 10, in combination with the socket 60, provides a microelectronic die connection assembly that allows for signals to be transmitted between the circuit board and the microelectronic die for purposes of testing the microelectronic die. Once burn-in testing is completed, the die carrier 10 is removed from the socket.

Figure 5:
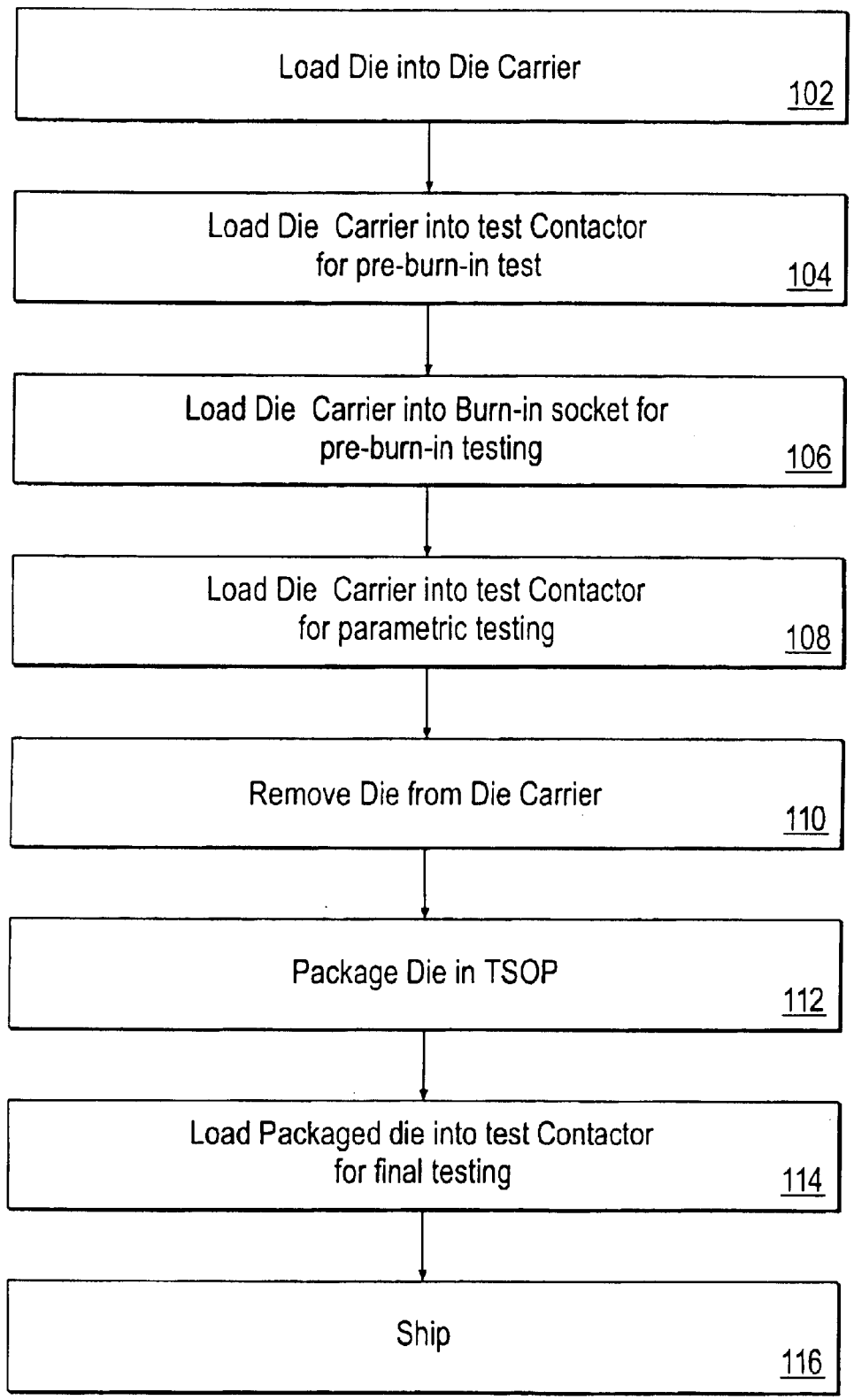
FIG. 5 is a block diagram illustrating testing of microelectronic dice according to the invention.

FIG. 5 illustrates the entire process for testing and packaging the die. The die is first loaded into the die carrier 10, as hereinbefore described with reference to FIG. 1 (Step 102). The die carrier 10 is then loaded into the test contactor for purposes of carrying out the pre-burn-in test (Step 104). The die carrier 10 is then removed from the test contactor and inserted into the burn-in socket 60 as hereinbefore described with reference to FIG. 3, for purposes of carrying out the burn-in testing (Step 106). More die carriers, each holding a respective die, are inserted into similar sockets on a burn-in board, and the burn-in board is then inserted into a burn-in oven where the burn-in testing is carried out. Following pre-burn-in testing, the burn-in board is removed from the burn-in oven, and the die carrier 10 is removed from the burn-in socket 60 and again inserted into the test contactor for purposes of carrying out parametric testing on the die (Step 108). The die carrier 10 is then removed from the test contactor and the die is then removed from the die carrier following the reverse of the process described with reference to FIG. 1 (Step 110). The die is then packaged in a conventional TSOP (Step 112), or is available to ship to a customer as a fully tested and burned-in bare die. The packaged die is then again loaded into the test contactor (Step 114). The layout of the contacts on the TSOP are the same as the layout of the contacts on the die carrier 10, so that the same test contactor can be used for purposes of testing the packaged die in Step 114 as for testing the die at Steps 104 and 108. Once final testing of the packaged die is completed, the packaged die is removed from the test contactor. The packaged die can then be shipped to a customer (Step 116).

Figure 6:
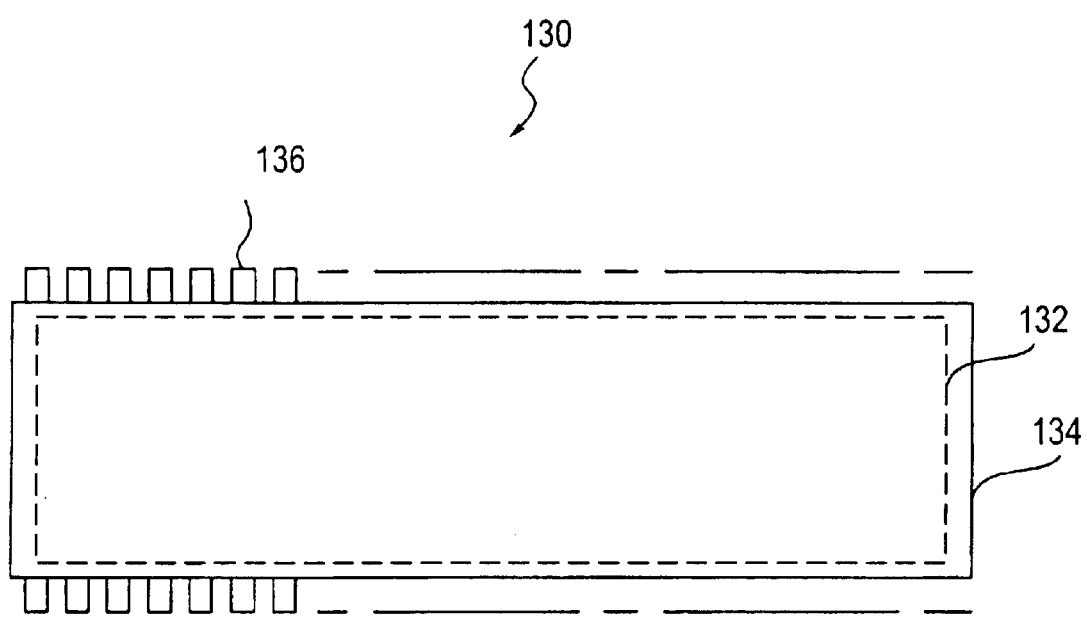
FIG. 6 is a top plan view of a typical TSOP electronic device that can be tested using the same equipment as in FIG. 3.

FIG. 6 illustrates a TSOP electronic device 130 of the kind tested in Step 114. The TSOP electronic device 130 includes a microelectronic die 132, permanently encapsulated with a material 134, and a plurality of leads 136 extending from the material 136. The positioning of the leads 136 is the same as the carrier contacts 52 in FIG. 2, which allows for the device 130 to be tested in the test contactor at Step 114. The same test contactor and the same socket 60 may be used to test other TSOP electronic devices that are identical to the device 130.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A microelectronic die connection assembly, comprising:
   a socket body;
   a plurality of electrically conductive circuit board connectors located externally on the socket body;
   left and right spaced rows of electrically conductive lower socket contacts on the socket body, at least some of the lower socket contacts of the left and right rows of lower socket contacts being electrically connected to at least some of the circuit board connectors;
   left and right spaced rows of electrically conductive upper socket contacts on the socket body, being actuable to move between retracted and contracting positions relative to the left and right rows of lower socket contacts respectively, at least some of the upper socket contacts of the left and right rows of upper socket contacts being electrically connected to at least some of the circuit board connectors;
   a carrier body having a retaining formation to temporarily and removably receive a microelectronic die;
   a plurality of die contacts in the retaining formation to make contact with respective ones of a plurality of terminals on the die; and
   left and right rows of carrier contacts on and extending from opposing sides of the carrier body, and being electrically connected to the die contacts, the left and right rows of carrier contacts being at a select spacing relative to one another so as to be insertable between the left and right rows of upper socket contacts when the left and right rows of upper socket contacts are in their retracted position and so that each carrier contact of the left and right rows of carrier contacts is located between a respective pair of upper and lower socket contacts of the left and right rows of upper and lower socket contacts when the left and right rows of upper socket contacts are in their contacting positions.

2. The connection assembly of claim 1, wherein each upper socket contact of the left and right rows of upper socket contacts is spaced from a respective lower socket contact of the left and right rows of lower socket contacts by a distance of between 135 and 155 microns when a respective carrier contact of the left and right rows of carrier contacts is located between the respective pair of socket contacts of the left and right rows of upper and lower socket contacts.

3. The connection assembly of claim 2, wherein a spacing between the left and right rows of upper socket contacts when in their contacting position is between 9 and 13 mm, and each of the left and right rows of lower socket contacts is between 18 and 24 mm long.

4. The connection assembly of claim 1, further comprising:
   a socket actuator component mounted to the socket body for movement between a raised position and a lowered position, the socket actuator component simultaneously moving the upper socket contacts of the left and right rows of upper socket contacts from their contacting positions into their retracted positions when moving from the raised position to the lowered position.

5. The connection assembly of claim 1, wherein the circuit board connectors are pins extending from a lower surface of the socket body.

6. The connection assembly of claim 1, further comprising:
a carrier substrate secured to the carrier body, the die contacts and the carrier contacts of the left and right rows of carrier contacts being formed on the carrier substrate, the carrier substrate further comprising carrier fan-out traces interconnecting the die contacts with the carrier contacts.

7. The connection assembly of claim 6, wherein the carrier contacts of the left and right rows of carrier contacts are lower carrier contacts on a lower surface of the carrier substrate and electrically contact respective ones of the lower socket contacts of the left and right rows of lower socket contacts.

8. The connection assembly of claim 6, wherein the carrier contacts of the left and right rows of carrier contacts are upper carrier contacts on an upper surface of the carrier substrate and electrically contact respective ones of the upper socket contacts of the left and right rows of upper socket contacts.

9. The connection assembly of claim 6, wherein the carrier contacts of the left and right rows of carrier contacts include lower carrier contacts on a lower surface of the carrier substrate that electrically contact respective ones of the lower socket contacts of the left and right rows of lower socket contacts and upper carrier contacts on an upper surface of the carrier substrate that electrically contact respective ones of the upper socket contacts of the left and right rows of upper socket contacts.

10. The connection assembly of claim 1, further comprising:
a carrier cover secured to the carrier body for movement between an open position wherein the die is insertable into or removable from the retaining formation and a closed position wherein the carrier cover holds the die within the retaining formation.

11. The connection assembly of claim 10, wherein the carrier cover is above the carrier substrate.

12. A method of testing electronic components, comprising:
inserting a bare microelectronic die into a die carrier;
inserting the die carrier with the bare microelectronic die into a socket, carrier contacts of the die carrier making contact with socket contacts of the socket;
testing the bare microelectronic die while the die carrier is in the socket;
removing the die carrier from the socket and the bare microelectronic die from the die carrier;
inserting a TSOP electronic device into the socket, the TSOP electronic device including a microelectronic die, a packaging material permanently encapsulating the microelectronic die of the TSOP electronic device, and a plurality of leads extending from the material, the leads making contact with the socket contacts of the socket;
testing the microelectronic die of the TSOP electronic device in the socket; and
removing the TSOP electronic device from the sockets.

13. The method of claim 12, wherein the bare microelectronic die is the microelectronic die of the TSOP electronic device.

14. The method of claim 12, wherein the socket is one of a plurality of sockets on a burn-in board.

* * * * *